United States Patent [19]
Rostoker et al.

[11] Patent Number: 5,744,399
[45] Date of Patent: Apr. 28, 1998

[54] PROCESS FOR FORMING LOW DIELECTRIC CONSTANT LAYERS USING FULLERENES

[75] Inventors: Michael D. Rostoker, Boulder Creek; Nicholas F. Pasch, Pacifica, both of Calif.

[73] Assignee: LSI Logic Corporation, Milpitas, Calif.

[21] Appl. No.: 557,721

[22] Filed: Nov. 13, 1995

[51] Int. Cl.$^6$ .................................................. H01L 21/316
[52] U.S. Cl. .................... 438/622; 438/778; 438/787; 438/790; 438/784
[58] Field of Search .................................... 437/235, 238, 437/241; 438/778, 781, 784, 787, 790, 622, 782

[56] References Cited

U.S. PATENT DOCUMENTS

| | | | |
|---|---|---|---|
| 5,294,600 | 3/1994 | Tanigaki | 505/1 |
| 5,300,203 | 4/1994 | Smalley | 204/157.41 |
| 5,310,532 | 5/1994 | Tour et al. | 423/445 B |
| 5,324,495 | 6/1994 | Gorun | 423/439 |
| 5,348,936 | 9/1994 | McCauley et al. | 505/460 |
| 5,364,993 | 11/1994 | Zhang et al. | 570/187 |
| 5,386,048 | 1/1995 | West et al. | 556/430 |
| 5,389,908 | 2/1995 | Sawada | 335/216 |
| 5,393,712 | 2/1995 | Rostoker et al. | 437/238 |
| 5,395,496 | 3/1995 | Tsantrizos et al. | 204/173 |
| 5,401,975 | 3/1995 | Ihara et al. | 250/492.3 |
| 5,420,081 | 5/1995 | Mattes et al. | 501/12 |

FOREIGN PATENT DOCUMENTS 5291412  11/1993  Japan.

OTHER PUBLICATIONS

Kroto et al., "C60: Buckminsterfullerene," *Chemical Reviews*, vol. 91, No. 6, 1991, pp. 1213–1235.

Edward Edelson, "Buckyball–The Magic Molecule", *Popular Science*, vol. 239, No. 2, Aug. 1991, pp. 52–57.

Ross, Billions of Buckytubes; Mass Production of Carbon Cylinders Sparks Interest, *Scientific America*, vol. 267, No. 4, Oct. 1992, pp. 115–117.

Zybill, "Si60, An Analogue of C60?", *Angew. Chem. Int. Ed. Engl.*, vol. 31, No. 2, 1992, pp. 173–175.

Piqueras et al., "VEH Electronic Structure of Si60," *Synthetic Metals*, vol. 61, 1993, pp. 155–158.

Kobayashi et al., "A Theoretical Study of the Stability of the Fullerene-Like Cage Structures of Silicon CLusters," *Bull. Chem. Soc. Jpn.*, vol. 66, No. 11, 1993, pp. 3334–3338.

Primary Examiner—Charles L. Bowers, Jr.
Assistant Examiner—Matthew Whipple
Attorney, Agent, or Firm—Luedeka, Neely & Graham PC

[57] ABSTRACT

A process for lowering the dielectric constant of a layer on a semiconductor wafer is described. The presence of the fullerene in the composite layer changes its dielectric constant. The process forms, on the wafer, a composite layer comprising matrix-forming material and a fullerene. The fullerene may be removed from the composite layer to leave an open porous layer. Removing the fullerene may be accomplished, for example, by contacting the composite layer with a liquid which is a solvent for the fullerene but not for the insulation material or by oxidizing the fullerene. The processes and insulation layers described are particularly useful for integrated circuits.

13 Claims, 3 Drawing Sheets

5,744,399

PROCESS FOR FORMING LOW DIELECTRIC CONSTANT LAYERS USING FULLERENES

BACKGROUND OF THE INVENTION

1. Field of the Invention

This invention relates to the production of layers on semiconductor wafers. More particularly, this invention relates to a process for lowering the dielectric constant of a layer, preferably an insulation layer, on a semiconductor wafer. The layers of the invention are particularly useful with integrated circuit structures and devices.

2. Description Of the Related Art

In circuits formed on semiconductor wafers, patterned conductive layers provide electrical connections between the active and passive devices which form the circuit structure. Smaller and more compact circuits shrink the feature sizes of such devices on the semiconductor wafer. This also shrinks the horizontal spacing between adjacent conductors on the same plane of the circuit structure. However, shrinking feature sizes results in a corresponding rise in the impedance of the conductors, as well as crosstalk between conductors. Increased impedance in the circuit structure can degrade circuit performance. For example, in an integrated circuit, increased impedance can reduce the response time of the active devices by increasing the impedance of the lines.

A need exists, therefore, to reduce the mount of capacitance formed between adjacent lines, either horizontally or vertically, and thereby reduce the impedance of the lines. Theoretically, this could be done by substituting a different insulation material having a lower dielectric constant, using some insulation material other than the commonly used silicon oxide, $SiO_2$. Alternatively, this may also be accomplished by somehow reducing the dielectric constant of a particular insulation material, e.g., reducing the dielectric constant of a typical $SiO_2$ insulation layer. Of these two alternatives, it is preferable to lower capacitance without the substitution of new insulation materials into the integrated circuit structure.

SUMMARY OF THE INVENTION

The invention comprises a process for forming a low dielectric constant layer, preferably an insulation layer, on a semiconductor wafer by providing a semiconductor wafer and forming a composite layer on the wafer. The composite layer contains one or more fullerenes and one or more matrix-forming materials. In a preferred embodiment, the low dielectric constant insulation layer is formed as part of an integrated circuit structure on a semiconductor wafer. The fullerene may also be selectively removed from the matrix-forming material leaving behind a open porous matrix of the material.

DETAILED DESCRIPTION OF THE INVENTION

Figure 1A:
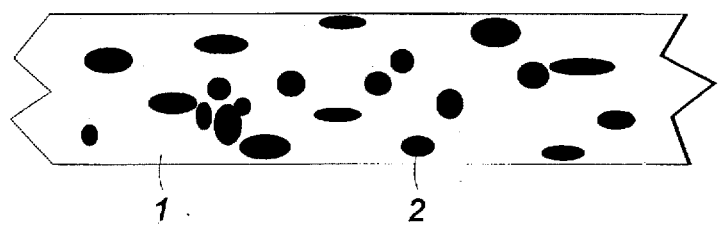
FIG. 1A to 1D depicts fragmentary vertical cross-sectional views of layers according to the invention.

The invention relates to a process for lowering the dielectric constant of a layer, preferably an insulation layer, on a semiconductor wafer. According to the process, a composite layer is formed on the semiconductor wafer. The composite layer contains one or more matrix-forming materials and a fullerene. Due to its cage-like structure, the fullerene creates pores in the composite layer and lowers the layer's dielectric constant. The fullerene may also be removed to form an open porous, low dielectric constant layer. The presence of a fullerene, or an open pore when the fullerene is removed, in the resultant layer of porous material reduces the overall dielectric constant of the insulation material. This effectively reduces the capacitance of the integrated circuit structure or device.

A composite layer of the invention may be used to form a low dielectric constant layer on any appropriate substrate. For clarity, the following discussion, while general for composite layers, focuses on the preferred insulation layer.

A low dielectric constant insulation layer is useful when forming an insulation layer between two conductive layers in a circuit on a semiconductor wafer. In an integrated circuit, for example, such an insulation layer may be employed between a conductive silicon layer (e.g., a doped polysilicon layer) and the first metallization layer or between metallization layers (or metal lines on the same layer). Those layers separating the conductive layers by a low dielectric constant insulation layer according to the invention.

To describe the resulting porous insulation material, the term "low dielectric constant", means a dielectric constant of less than about 3.9. For comparison, a conventional $SiO_2$ insulation material has a dielectric constant of 3.9.

FIG. 1 depicts various layers according to the invention. FIG. 1A depicts a low dielectric constant composite layer comprising a matrix-forming material 1 and fullerenes 2. As shown in FIG. 1A, the fullerenes in the porous layer may be spread apart or in contact with one another forming a sponge-like layer. In general, the fullerene pores have the shape of the fullerene. FIG. 1B depicts a layer according to the invention where the fullerenes have been substantially removed from the layer forming open pores 3. As shown in FIG. 1B, the porous and/or sponge-like character of the layer remains. The open pores may retain the shape of the fullerene or adopt a shape formed due to the removal of the fullerene. FIGS. 1C and 1D show layers where removing the fullerenes has formed channels 4 (pores extending through or perforating the layer) or holes 5 (pores existing at the layer's surface) in the layer. One of ordinary skill would appreciate that removing fullerenes from a layer may result in open pores, sponge-like pores, channels, and holes-a mixture of FIGS. 1B–D.

Figure 2:
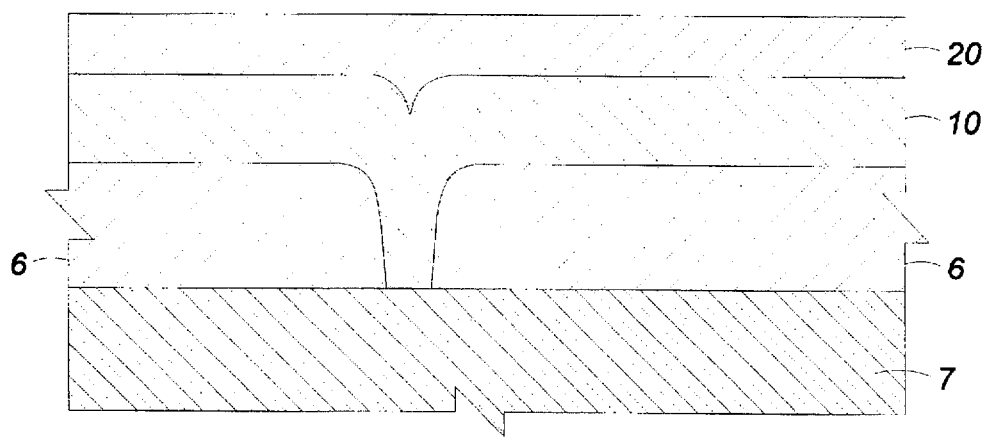
FIG. 2 is a fragmentary vertical cross-sectional view showing the formation, over an integrated circuit structure on a semiconductor wafer, of a low dielectric constant insulation layer of the invention.

FIG. 2 depicts one application of an insulation layer according to the invention. In the integrated circuit shown, a conductive polysilicon layer 10 is formed over oxide portions 6 and an integrated circuit structure, generally designated at 7. As shown, the low dielectric insulation layer 20 of the invention is formed directly over polysilicon layer 10.

The low dielectric constant insulation layer 20 shown in FIG. 2, comprises at least two materials: at least one matrix-forming insulation material and a fullerene. In a preferred embodiment, the fullerene may be removed from the matrix-forming material after the composite layer is applied to the semiconductor wafer or, as shown in FIG. 2, the surface of the integrated circuit structure.

In its simplest form, a binary mixture of a matrix-forming insulation material and a fullerene forms the composite layer. However, a mixture of fullerenes and/or a mixture of matrix-forming insulation materials may be used. Other components known to those skilled in the art to add beneficial properties to the layer may also be employed to form or makeup the composite layer.

The Matrix-Forming Material

A matrix-forming material, preferably a matrix-forming insulation material, suitable for use in a semiconductor wafers may be used in the practice of this invention. Inorganic insulation materials include, but are not limited to, materials such as silicon oxide ($SiO_2$), silicon nitride ($Si_3N_4$), aluminum oxide ($Al_2O_3$), and undoped silicon (including polysilicon). Organic materials such as, for example polyimide, may also be used as the matrix-forming material. Of these matrix-forming materials, however, silicon oxide ($SiO_2$) is the preferred material. Preferably, the matrix-forming insulation material (or materials) is capable of forming a porous matrix which will remain after removal of the fullerene resulting in a low dielectric constant insulation layer.

The Fullerene

Fullerenes are a recently discovered, new form of naturally occurring carbon. Named for Buckminster Fuller, the architect of the geodesic dome, fullerenes can contain anywhere from 32 to as many as 960 carbon atoms and are all believed to have the structure of geodesic domes. The molecules are also called "buckminsterfullerenes" or "buckyballs" for short. Fullerenes of other elements, such as silicon, have been predicted. See Piquera et al., *Synthetic Metals*, 61, (1993), 155–158; Kobayashi et al., *Bull. Chem. Soc. Jpn.*, 66, (1993), 3334–3338; and Zybill, *Angew. Chem. Int. Ed. Engl.*, 31, (1992), 173–175. While the following discussion generally describes the use of carbon fullerenes and their derivatives, fullerenes of other elements and their derivatives may be substituted for the carbon fullerenes without departing from the present invention.

Sixty-carbon fullerenes, ($C_{60}$), are highly stable, insulative compounds and have received the most attention. Fullerenes containing 70 carbon atoms ($C_{70}$) are also highly stable. Molecules containing very large numbers of carbon atoms are also called "hyperfullerenes".

Several recent articles describe various fullerenes and their uses and potential applications. For example, Edward Edelson's article entitled "BUCKYBALL—The Magic Molecule", published in Popular Science, August 1991, provides a good review of the discovery, methods of production and uses of fullerenes or "buckyballs". Another good description, of $C_{60}$ fullerenes in particular, is provided in Chemical Reviews 1991 of the American Chemical Society by Kroto et al., pp 1213–1235. Kroto's article describes the isolation, separation and structure characterization of the most useful fullerenes—$C_{60}$ and $C_{70}$.

A large variety of fullerenes, fullerene-derivatives and other variations have been prepared and are known. For example, the preparation and purification of fullerenes is described in U.S. Pat. Nos. 5,300,203, 5,310,532, and 5,395,496. Superconducting fullerenes are described in U.S. Pat. No. 5,294,600. U.S. Pat. No. 5,324,495 describes metal fullerides and methods for making them. Metal-doped fullerenes and their synthesis are disclosed in U.S. Pat. No. 5,348,936. Selective functionalization of fullerenes is described in U.S. Pat. No. 5,364,993. Hydrosylation of fullerenes to provide silicon-substituted fullerenes are described in U.S. Pat. No. 5,386,048. Toroidal and helical fullerene-like compounds are described in U.S. Pat. No. 5,401,975. Buckytubes, analogous in structure to fullerenes, have been described in Scientific American, October 1992, vol. 267, pa. 115. All of the above articles and patents are incorporated herein by reference. In the present invention, the term "fullerene" encompasses all of these various fullerene-like molecules and their derivatives.

Any fullerene or mixture of fullerenes may be used in a composite layer together with a matrix-forming material. With their varying size, shape, and composition, fullerenes provide unique control and choice as to how or how much to change or lower the dielectric constant of an insulation layer.

For example, using only $C_{60}$ provides a uniform dopant with which to lower the dielectric constant of an insulation layer. This is particularly true because the $C_{60}$ may remain in the layer, or be subsequently removed, forming a porous layer—one having substantially uniform pore size. Pore sizes may also vary depending upon the proximity of fullerenes to each other in the insulation layer, e.g., forming a sponge-like pore system. See FIGS. 1B—D. Variations in fullerene shape or size provide the same type of design choices and the ability to determine not only pore size but also pore shape. The strength and resiliency of fullerenes may also be used to strengthen or reinforce the composite layer while lowering its dielectric constant.

Use of a doped or derivatized fullerene, introduces another variation for a given fullerene and should allow variation based on the type of dopant or derivatization. Selective removal of only the carbon portion of a doped or derivatized fullerene leaves a new chemical species inside the pores of the insulation material.

As discussed above, a preferred embodiment substantially removes the fullerenes from the composite layer. It is not mandatory that the fullerenes be strong insulators. Conductive fullerenes may be used or mixed with insulative fullerenes to vary the change in dielectric constant. However, it is preferable that insulative fullerenes be used since it is possible that all of the fullerenes may not be removed, either by choice or based on the method of removal.

Forming the Composite Layer on the Semiconductor Wafer

The method used to form the composite layer on a semiconductor wafer or over a circuit structure should not destroy the fullerene or the matrix-forming material while forming the composite layer. Exemplary methods include, but are not limited to, a dry method such as a CVD-type deposition, or a wet method such as dissolving or dispersing a dry mixture of the matrix-forming insulation material and the fullerene in a liquid and then applying the resulting solution or dispersion as a viscous coating material over the wafer. A preferred wet method spins the coating material on the wafer in similar fashion to the application of a photoresist mask layer. Another preferred embodiment forms the composite layer as a spin-on glass. In that embodiment, the fullerene is added as a component of the glass composition.

Other deposition processes known in the art may also be used such as, for example, a low temperature oxide (LTO) deposition process wherein the wafer temperature during deposition is maintained within a range of from room temperature, i.e., about 20° C. to about 500° C. A plasma-enhanced chemical vapor deposition (PECVD) process may also be used to form the composite layer.

Such methods for forming the composite layer are more fully described in U.S. Pat. No. 5,407,801 entitled LOW DIELECTRIC CONSTANT INSULATION LAYER FOR INTEGRATED CIRCUIT STRUCTURE AND METHOD OF MAKING SAME, issued on Nov. 28, 1995. The disclosure of that application is incorporated here by reference.

The ratio of matrix-forming insulation material to fullerene in the resulting composite layer may range from as little as 0.5 wt. % matrix forming material up to as high as 50 wt. %, or even higher if so desired. Usually the matrix-forming insulation material will comprise at least about 5 wt. % of the mixture and may be a higher minimum amount. The minimum amount generally depends on the desired structural strength or integrity of the insulation layer or, if the fullerene is removed, of the resulting insulation layer. When the fullerene is removed from the insulation layer, the desired strength of the resulting porous insulation layer matrix may also depend on the particular technique used to remove the fullerene. Various techniques are discussed below.

The ratio of matrix-forming material to fullerene also affects the decrease in dielectric constant of the insulation layer. This is particularly true in embodiments where the fullerene is removed to form an open porous insulation layer.

The maximum amount of matrix-forming material used may, therefore, depend upon the desired change in the dielectric constant of the final low dielectric constant insulation layer. As one of ordinary skill would appreciate, both mechanical strength and dielectric constant also depend upon the type of material used as the matrix-forming material. Neither parameter will necessarily vary linearly with concentration. Thus, the exact ratio of matrix-forming material to fullerene for a given composite layer may be determined empirically (or otherwise) for the particular composite layer.

In the formation of the composite layer, one or more dopants may also be added to affect the properties of the insulation layer. The dopants may or may not affect the dielectric properties of the layer. For example, a dopant may be added to permit the resulting composite layer to flow at a lower temperature, either during the deposition or upon subsequent heating, for planarization purposes. Preferably, from 0 to about 5 wt. % (based on the weight of the matrix-forming material in the composite mixture) of boron, phosphorus, or arsenic dopants, or mixtures of same, may be used for this purpose. Preferably, the total weight of the dopants in the resulting composite layer should not exceed about 10 wt. % of the non-fullerenes in the composite layer.

The thickness of the composite layer may also vary depending upon the desired application and the structural integrity of the insulation material. Thicker composite layers may be desirable for those embodiments in which some or all the fullerenes are removed to form a porous insulation layer. Typically, the thickness of the composite layer may range from as low as about 200 Angstroms to as much as about 20,000 Angstroms, or even thicker in particular instances.

Figure 1B:
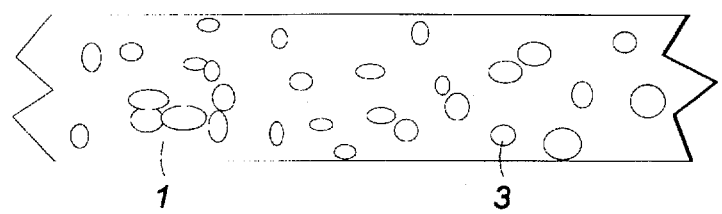
Figure 1C:
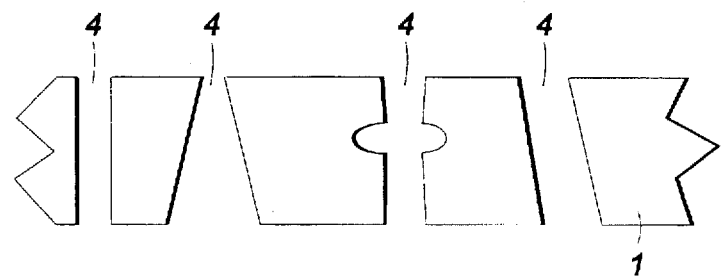
Figure 1D:
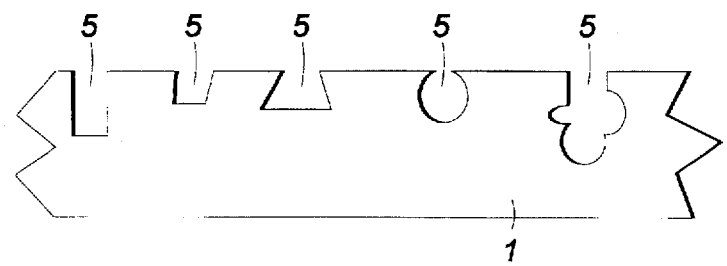

In a preferred embodiment, the resulting low dielectric constant insulation layer, after removing the fullerene, will be a porous layer such as those depicted in FIGS. 1B–D. Impurities (including dopants) trapped within the porous layer, or included in the matrix-forming material, may gradually move to the surface of the low dielectric constant insulation layer. This may cause reliability problems. Therefore, in a further preferred embodiment of the invention, the low dielectric constant layer is formed with one or more lower and upper solid encapsulation or capping layers to prevent or inhibit such migration. Encapsulation layers may, for example, simply comprise conventionally deposited $SiO_2$ layers or dual layers of $SiO_2$ and $Si_3N_4$, as will be further described below. Alternatively, the encapsulation layer may be an insulation layer according to the invention, preferably without removing the fullerene or having a different composition than the insulation layer being capped. The optional encapsulation layers may range in thickness, for example, from as little as 100 Angstroms to as much as 1000 Angstroms or even higher, if necessary or desired.

Figure 3:
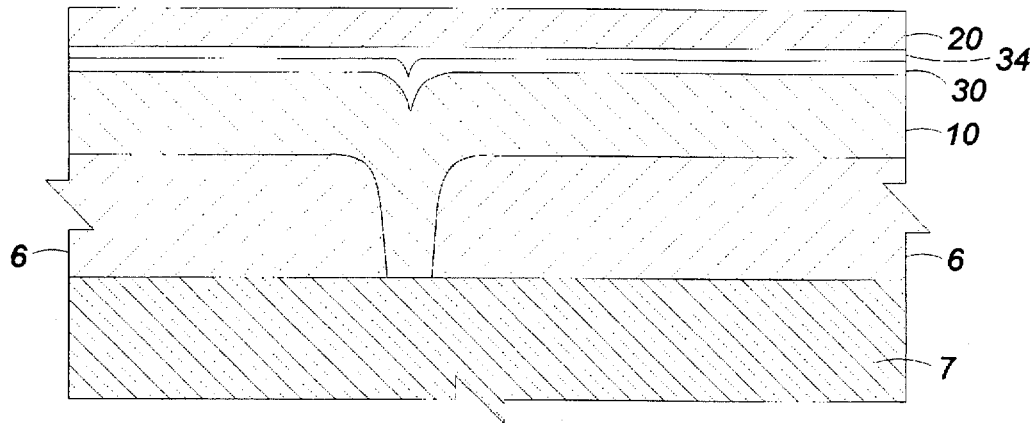
FIG. 3 is a fragmentary vertical cross-sectional view showing formation of a low dielectric constant insulation encapsulation layer over a dual layer of non-porous insulation material.

The use of solid encapsulation or capping layers is illustrated in FIG. 3. As shown, a first solid insulation layer 30 of silicon oxide is formed over conductive polysilicon layer 10 of FIG. 2. A second solid insulation layer 34, which may comprise for example silicon nitride, is shown formed over insulation layer 30. Together, insulation layers 30 and 34 comprise a dual encapsulation or capping layers which serve to seal the underlying portions of integrated circuit structure 7 and polysilicon layer 10 from composite layer 20 a low dielectric constant insulation layer according to the inventor.

Figure 4:
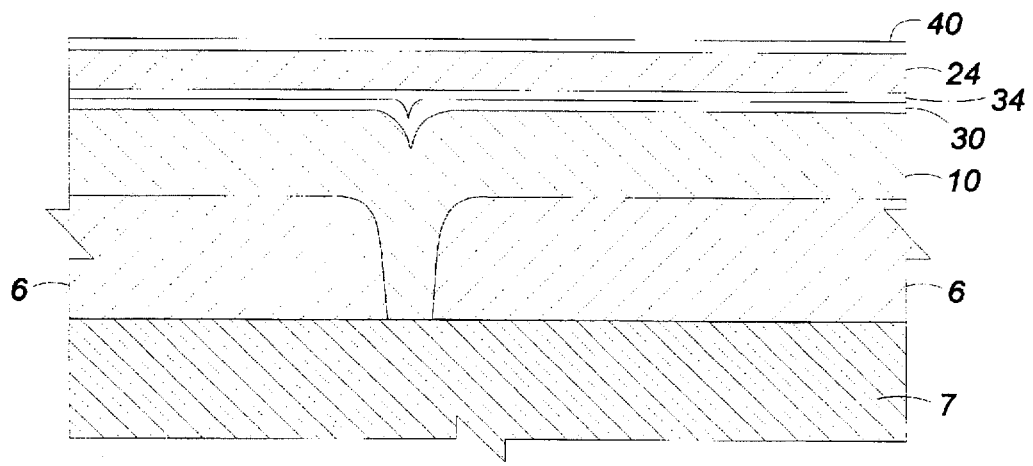
FIG. 4 is a fragmentary vertical cross-sectional view of the structure of FIG. 3 after removal of the fullerene from the composite layer to form a porous low dielectric constant insulation layer and after formation of a single encapsulation layer over the porous low dielectric constant insulation layer.

As shown in FIG. 4, an upper capping or sealing layer 40, which may also comprise $SiO_2$, can then be formed over the structure. For the preferred porous insulation layers, the upper capping or sealing layer is formed after the fullerene has been removed to form low dielectric constant porous insulation layer 24 of the invention (formerly composite layer 20 of FIG. 3). The lower encapsulation or capping layer has been shown formed from two layers of material (layers 30 and 34). Upper encapsulating or capping layer 40 is shown as a single layer. This is only for illustrative purposes. Either the lower or upper encapsulation layer may comprise a single layer, a dual layer or other multi layer structure, as desired.

A porous, low dielectric constant layer according to the invention may be highly hygroscopic in nature. In this case, it is preferable to seal the porous layer by using one or more encapsulating or capping layers beneath composite layer 20, such as, for example, non-porous layers 30 and 34, as shown in FIG. 3; and one or more non-porous sealing layers above porous layer 24, such as, for example, layer 40, as shown in FIG. 4. Thus, encapsulating or capping layers may serve the additional function of isolating the hygroscopic low dielectric constant insulation layer from contact with aqueous media which may be used in subsequent processing of other circuit structure on the semiconductor wafer.

After formation of composite layer 20, the integrated circuit structure may be heated, if desired, to cause layer 20 to flow for planarization purposes. When no metallization is already present on the integrated circuit structure, nor any prior porous insulation layers already formed, the structure may be heated to a temperature of typically from about 200° C. up to about 1100° C. preferably from about 400° C. to about 800° C. If a metal layer (and/or a first porous insulation layer) has already been formed and the (second) low dielectric constant insulation layer of the invention is being formed, heating the structure for planarization purposes will be governed by the melting point of the already deposited metal layer (as well as the effect on the previously formed porous layer). For aluminum metallization, for example, the structure should not be heated to a temperature above about 500° C. For copper, for example, the temperature should not exceed about 1000° C. Of course, it will be recognized that such planarization may also be carried out by chemical or mechanical polishing or a combination of techniques. Polishing will be found to be particularly useful in those instances where heating the wafer to cause the composite layer to flow, for planarization purposes, would create problems elsewhere on the structure.

Removing the Fullerene from the Composite Layer

The fullerene may be removed from the composite layer using either chemical means, such as oxidation, or physical means, such as solution techniques. Removing the fullerene from the composite layer results in an insulation layer which may have a lower dielectric constant than a non-porous layer without the fullerene. This represents a preferred embodiment of the invention.

Preferably, the fullerene is removed from the composite layer by oxidation. Oxidizing techniques used in the semiconductor art may be used to remove carbonaceous materials from layers used in circuit devices may be employed to remove the fullerene from the composite layer. For example, the oxidative conditions used to remove carbonaceous binders from spin-on glass may be used to remove the fullerene.

Alternatively, techniques employing oxygen plasmas or ozone can be used. Where the fullerene contains only carbon, oxidation will cause the formation of carbon dioxide. Where the fullerene has been derivatized, oxides of the other elements may be formed and may or may not leave the porous insulation material. If the other elements do not leave the porous insulation material under the oxidation conditions, they or their oxides may be left in the pore itself or may migrate into the insulation layer. The conditions of the oxidative removal of a fullerene should not cause all of the pores to collapse after the fullerene is removed. Preferably, the conditions allow the fullerene to be removed without any pore collapsing.

The fullerene may also be removed from the composite layer by contacting the composite layer with a liquid (or in some instances a gas) which is a solvent for the fullerene, but not the matrix-forming insulation material. This dissolves or leaches the fullerene out of the composite layer, i.e., forming a solution of the fullerene in the solvent. This solution is then removed from the composite layer.

The liquid (or solvent) used to remove the fullerene is preferably a purified liquid, that is, a semiconductor grade solvent or better. Mixtures of appropriate purified liquids or solvents may also be used. Fullerenes are generally soluble in non-polar organic solvents such as benzene or toluene. The choice of solvent will depend on the particular fullerene. For example, purified toluene may be used for $C_{60}$, while purified water, e.g., distilled or deionized water, may be used to leach out an ionized fullerene from the composite layer.

Removing the fullerene by dissolving it in a solvent may be carried out, for example, by immersing the coated wafer for a time period of at least about 2 minutes up to as long as about 3,000 minutes (50 hours) or longer if desired. This may also be done for example, at temperatures ranging from ambient up to about just below the vaporization point of the liquid. Multiple immersions or washings may be used. Whether or not all of the fullerene has been removed may be determined by monitoring the concentration of the fullerene in the subsequent washings. Complete removal may not always be desirable or necessary as the hollow nature of the fullerene may provide the desired porosity to reduce the dielectric constant of a particular insulation layer.

The resulting solution, comprising the solvent and the dissolved fullerene, may then be removed from the coated wafer with the composite layer. This is best carried out by placing the coated wafer in fresh solvent or by rinsing with fresh solvent. This may also be accomplished using a second liquid miscible with the first solvent. Where complete removal of the fullerene is not desired, the fullerene should preferably have only limited or no solubility in the second liquid. If a second liquid is used as a wash or rinse liquid, it preferably should not be a solvent for the non-fullerene components of the composite layer. The washings or rinsings may be done at least once and preferably a number of times until all of the solution, i.e., substantially all of the dissolved fullerene, is no longer in or on the resulting porous insulation layer. The phrase "substantially all" means that less than 95%, preferably less than 99%, of the dissolved fullerene remains in the resulting porous matrix structure. Varying this procedure allows one to control the amount of fullerenes removed from the layer.

This solvent method should preferably remove the fullerene without destroying it. Thus, any fullerene removed in this manner may be recovered from the solvent and used again to form other layers according to the invention.

Any residual solvent remaining in the porous insulation layer or on the semiconductor wafer may be removed by evaporation or other drying techniques known in the art. This may be carried out for example, by vacuum drying the layer in a vacuum dryer for a sufficient period of time.

The residual solvent may also be removed by a lyophilizing (freeze drying) process or a critical point process in which the temperature and pressure are raised to the critical point at which no liquid phase exists. Either of these removal processes eliminate the problem where the surface tension of the liquid phase exceeds the strength of the porous insulation layer, which could damage its matrix structure. These removal processes will be found to be of particular value when the ratio of matrix-forming material to fullerene is low, resulting in a more fragile, and easily damaged matrix structure remaining after the fullerene has been from the composite layer. Lyophilizing process and critical point processes are described in U.S. Pat. No. 5,393,712 which is incorporated herein by reference.

When a critical point process is used to remove the residual solvent, the solvent chosen to remove the fullerene or wash the porous layer should have a low enough pressure and temperature at the critical point to be economically feasible and practical. Water is not a preferred solvent, when the critical point method of removal is used, because of its high temperature/pressure critical point. However, alcohols and other organic solvents do have a low enough critical point temperature and pressure to permit their use as the solvent in a critical point removal process. For example, ethyl alcohol (containing dissolved extractable material) will have a critical point temperature ranging from about 350° C. to about 400° C. and a critical point pressure of about 100 atmospheres. Examples of other liquids, besides alcohols, which may serve as the second solvent in a include, for example, 2-methyltetrahydrofuran (TMF).

After it is formed, a semiconductor wafer having a low dielectric constant insulation layer of the invention (containing fullerenes or a porous layer after fullerene removal) may undergo further processing known in the art to form a variety of circuits. This includes formation of additional low dielectric constant layers according to the invention. Thus, in one embodiment, the invention provides an integrated circuit device comprising a semiconductor substrate, at least one first insulation layer disposed upon the semiconductor substrate, at least one conductive layer disposed upon the first insulation layer, at least one second insulation layer disposed upon the conductive layer, and at least one metallization layer disposed upon the second insulation layer. In the integrated circuit device, the first or second insulation layer, or any other insulation layer, contains a matrix-forming insulation material and a fullerene. As discussed above, the fullerene may be removed from the insulation layers.

Integrated circuits having a low dielectric constant layer according to the invention may be used in the same manner as conventional integrated circuits. Exemplary integrated circuit devices having a low dielectric constant layer according to the invention include, but are not limited to, microprocessors, random access memory devices, read-only memory devices, ETHERNET hubs, and ATM controller devices. These circuits, for example, may be used in computer or communication systems.

A low dielectric constant layer of the invention may also be used as a protective layer on an integrated circuit. To form the protective layer, a composite layer comprising matrix-forming material and a fullerene is formed on the integrated circuit device. The fullerene may be subsequently removed from the composite layer as discussed above.

As discussed, a low dielectric constant layer may also be used to insulate an integrated circuit device. Thus, another embodiment of the invention relates to a method for insulating a semiconductor device. This is accomplished by providing a semiconductor substrate, forming at least one first insulation layer upon the semiconductor substrate, forming at least one conductive layer upon the first insulation layer, forming at least one second insulation layer upon the conductive layer, and forming at least one metallization layer upon the second insulation layer. At least one of the first or second insulation layer is a composite layer comprising matrix-forming insulation material and a fullerene. The fullerene may be substantially removed from any or insulation layers in the integrated circuit device using the steps discussed above. Thus, this method may include appropriate steps to remove the fullerene from an insulation layer after it has been formed. One of ordinary skill would appreciate that the method may also include other processing steps to prepare a desired type of integrated circuit device.

Figure 5:
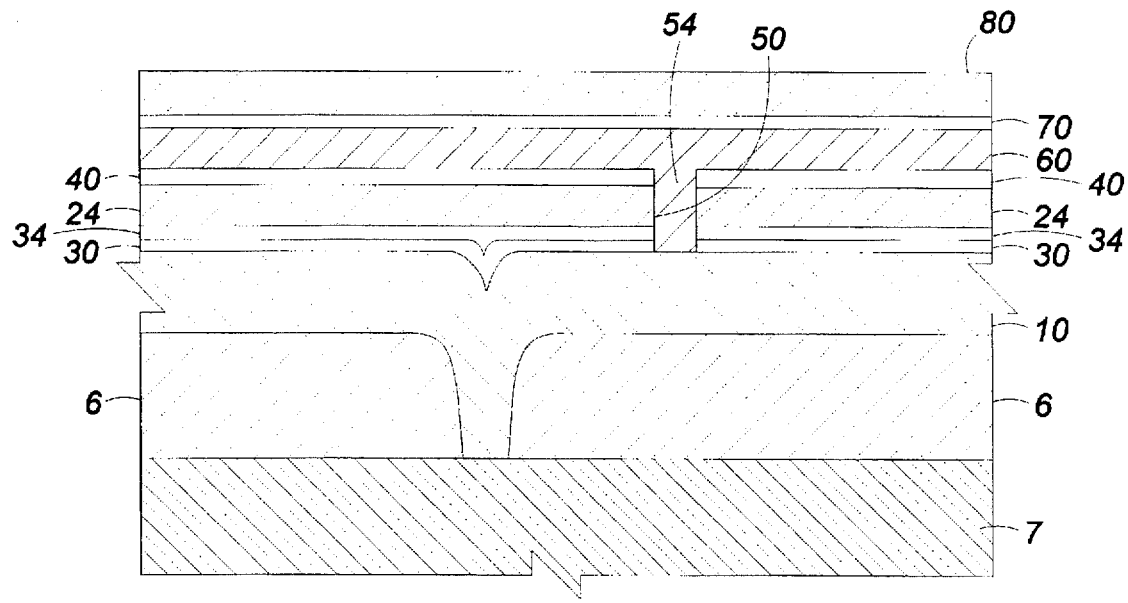
FIG. 5 is a fragmentary vertical cross-sectional view of the structure of FIG. 4 after formation of a contact opening in the first low dielectric constant insulation layer, a patterned first metallization layer formed over the insulation layer, a capping layer formed over the first metallization layer, and a second composite layer formed over the structure in preparation for forming a second low dielectric constant insulation layer.

For example, if desired, a capping layer 40 of non-porous insulation material may be formed over a porous, low dielectric constant insulation layer 24, as shown in FIG. 4. Capping layer 40 is formed similarly to the encapsulation layer or layers (30 and 34) formed over the integrated circuit structure beneath porous low dielectric constant insulation layer 24. Such a capping layer may be conventionally formed using the same techniques previously described for forming encapsulation layers. FIG. 5 depicts the use of low dielectric constant insulation layers according to this invention in an integrated circuit. As shown in FIG. 5, to create an integrated circuit, vias or contact openings 50 may be formed in the insulation layer 24, followed by filling of contact opening with a conductive filler material 54, such as tungsten. A metallization layer 60 may then be formed over low dielectric constant insulation layer 24 and capping layer 40 (if used). If capping layer 40 is used, the patterning to form the desired vias or contact openings 50 may be applied over the upper surface of layer 40.

It should be noted that if one or more dopant materials are used in the formation of the low dielectric constant insulation layer, care should be taken in material selection for the filler material to be used in the contact openings. The capping or encapsulation layers placed above and below the low dielectric constant layer will not prevent leaching or migration of the dopant where the low dielectric constant insulation layer is exposed at the contact opening. Thus, for example, it may be preferably to use tungsten as a filler material for the contact opening.

Referring to FIG. 5, the structure depicted in FIG. 4 is shown formed having a contact opening 50 filled with a conductive filler material 54 such as tungsten, a first metallization layer 60 formed over capping layer 40, and a first low dielectric constant insulation layer 24. The first metallization layer 60 is patterned to form the desired interconnects.

A capping or encapsulation layer 70 is formed over first metallization layer 60 in preparation for forming a second low dielectric constant insulation layer. This second low dielectric constant insulation layer may be formed in the same manner as first low dielectric constant insulation layer 24. First, a second composite layer 80, which may be identical in composition to first composition layer 20, is formed and then, if desired, by removing the fullerene using one of the techniques previously discussed. However, as previously discussed, care must be exercised if it is desired to heat second composite layer 80 prior to the fullerene removal step to planarize it. Excessive heat may damage either first metallization layer 60 or first low dielectric constant insulation layer 24.

Figure 6:
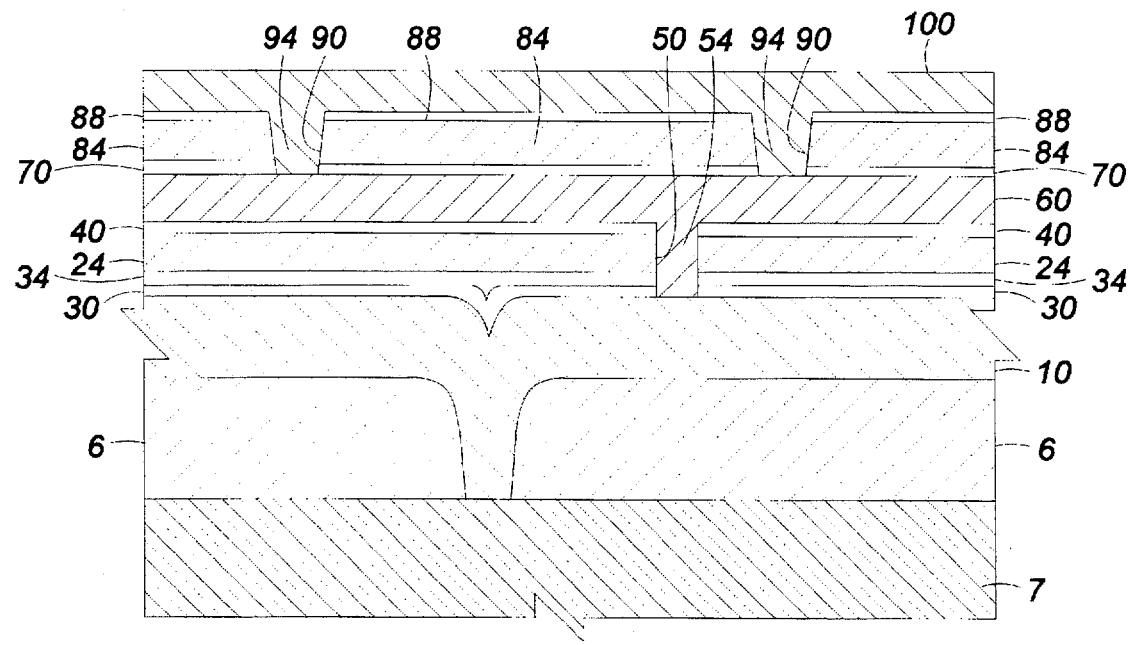
FIG. 6 is a fragmentary vertical cross-sectional view of the structure of FIG. 5 after formation of the second low dielectric constant insulation layer, formation of contact openings therein, and formation of a patterned second metallization layer over the second low dielectric constant insulation layer.

As shown in FIG. 6, after forming a second low dielectric constant insulation layer 84 from second composite layer 80 shown in FIG. 5, a capping layer 88 may be optionally formed over the second low dielectric constant insulation layer 84. The second low dielectric constant insulation layer 84, and capping layer 88 (if formed) may then be patterned to form contact holes 90 to first metallization layer 60. The contact holes 90 may then be filled with conductive filler material 94 similarly to the filling of contact hole 50, and a second metallization layer 100 deposited over the structure and patterned. This process may be repeated as needed or desired to form further low dielectric constant insulation layers, according to the invention, for any subsequent metallization layers used in the circuit structure.

The following examples will serve to further illustrate the process of the invention:

EXAMPLE I

A first sealing layer of non-porous $SiO_2$ may be first deposited by CVD over an integrated circuit structure on a semiconductor wafer to a thickness of about 0.05 μm. Then about 1 μm of a composite layer, comprising about 90 wt. % $SiO_2$, 8 wt. % $C_{60}$ fullerene and 2 wt. % phosphorus, is deposited by CVD over the newly deposited non-porous $SiO_2$ layer. The composite layer is then contacted with purified toluene to remove the fullerene and thereby provide a porous, phosphorous-doped solid matrix of $SiO_2$. The resulting toluene solution may now be removed from the composite layer and replaced with fresh toluene by rinsing the composite layer until no further fullerene is found in the rinsings. Any residual is then removed from the composite layer by vacuum with periodic weighings of the coated wafer. When a constant weight is achieved, the vacuum drying may be stopped. A further sealing layer of non-porous $SiO_2$ may be then deposited over the resulting porous low dielectric constant $SiO_2$ insulation layer to a thickness of about 0.1 μm.

EXAMPLE II

A first sealing layer of non-porous $SiO_2$ may be first deposited by CVD over an integrated circuit structure on a semiconductor wafer to a thickness of about 0.05 μm. Then about 1 μm of a composite layer, comprising about 90 wt % $SiO_2$, 8 wt % $C_{60}$ fullerene and 2 wt % phosphorus, is deposited by CVD over the newly deposited non-porous $SiO_2$ layer. The composite layer is then contacted with an oxygen plasma to remove the fullerene and thereby provide a porous, phosphorous-doped solid matrix of $SiO_2$. A further sealing layer of non-porous $SiO_2$ may be then deposited over the resulting porous low dielectric constant $SiO_2$ insulation layer to a thickness of about 0.1 μm.

EXAMPLE III

A first sealing layer of non-porous $SiO_2$ may be first deposited by CVD over an integrated circuit structure on a semiconductor wafer to a thickness of about 0.05 μm. Then about 1 μm of a composite layer, comprising about 90 wt % $SiO_2$, 8 wt % $C_{60}$ fullerene and 2 wt % phosphorus, is deposited by CVD over the newly deposited non-porous $SiO_2$ layer. A further sealing layer of non-porous $SiO_2$ may be then deposited over the resulting porous low dielectric constant $SiO_2$ insulation layer to a thickness of about 0.1 μm.

Thus, the invention provides a process for forming a low dielectric constant layers on a semiconductor wafer. The layer is a composite layer, preferably an insulation layer, which includes one or more matrix-forming insulation materials and one or more fullerenes. In a preferred embodiment, removing the fullerene leaves behind an open porous matrix of the material. The composite layer containing a fullerene or open pores, has a lower dielectric constant which lowers the capacitance within a circuit structure formed with such an insulation layer or layers.

The claimed invention is:

1. A process for lowering the dielectric constant of an insulation layer on a semiconductor wafer which comprises:
   a) forming on the wafer a composite layer comprising matrix-forming insulation material and a fullerene; and
   b) removing the fullerene from the composite layer to leave an open porous structure comprising the insulation material.

2. A process of claim 1, wherein said step of removing the fullerene further comprises:
   a) contacting said composite layer with a liquid which is a solvent for the fullerene but not for the insulation material to form a solution of the liquid and the fullerene; and
   b) removing the solution from the composite layer.

3. A process of claim 2, wherein the composite layer is formed as a spin-on glass, the matrix-forming insulation material comprises silicon oxide and the fullerene is a $C_{60}$ fullerene or derivative thereof.

4. A process of claim 1, wherein said step of removing the fullerene comprises oxidizing the fullerene.

5. A process of claim 4, wherein the composite layer is formed as a spin-on glass, the matrix-forming insulation material comprises silicon oxide and the fullerene is a $C_{60}$ fullerene or derivative thereof.

6. A process of claim 1, wherein the composite layer is formed as a spin-on glass, the matrix-forming insulation material comprises silicon oxide and the fullerene is a $C_{60}$ fullerene or derivative thereof.

7. A process for forming a low dielectric constant layer on an integrated circuit structure which comprises:
   a) providing an integrated circuit structure,
   b) forming over the integrated circuit structure a composite layer comprising matrix-forming material and a fullerene, and
   c) removing the fullerene from the composite layer to leave a porous structure comprising the matrix-forming material on the integrated circuit structure.

8. A process of claim 7, wherein said step of removing the fullerene further comprises:
   a) contacting said composite layer with a liquid which is a solvent for the fullerene but not for the matrix-forming material to form a solution of the liquid and the fullerene; and
   b) removing the solution from the composite layer.

9. A process of claim 8, wherein the composite layer is formed as a spin-on glass, the matrix-forming material comprises silicon oxide and the fullerene is a $C_{60}$ fullerene or derivative thereof.

10. A process of claim 7, wherein said step of removing the fullerene comprises oxidizing the fullerene.

11. A process of claim 10, wherein the composite layer is formed as a spin-on glass, the matrix-forming material comprises silicon oxide and the fullerene is a $C_{60}$ fullerene or derivative thereof.

12. A method of forming a protective layer on an integrated circuit which comprises:
   a) providing an integrated circuit,
   b) forming on the integrated circuit a composite layer comprising matrix-forming material and a fullerene, and
   c) removing the fullerene from the composite layer.

13. A process for insulating an integrated circuit comprising the steps of;
   providing semiconductor substrate,
   forming at least one first insulation layer upon the semiconductor substrate,
   forming at least one conductive layer upon the first insulation layer,
   forming at least one second insulation layer upon the conductive laey and
   forming at least one metallization layer upon the second insulation layer,
   wherein at least one of the first or second insulation layer is a composite layer comprising matrix-forming insulation material and a fullerene, and
   removing the fullerene from the composite layer to form the insulation layer.

* * * * *